TRAVELING WAVE COUPLED CAVITY PARAMETRIC AMPLIFIER

Filed June 5, 1961

3 Sheets-Sheet 1

INVENTOR.
KENNETH P. GRABOWSKI,
BY
Robert H. Himes
ATTORNEY

INVENTOR.
KENNETH P. GRABOWSKI,
BY Robert W. Hines
ATTORNEY

TRAVELING WAVE COUPLED CAVITY PARAMETRIC AMPLIFIER

Filed June 5, 1961 3 Sheets-Sheet 3

INVENTOR
KENNETH P. GRABOWSKI,
BY Robert H. Himes
ATTORNEY

United States Patent Office 3,068,422
Patented Dec. 11, 1962

3,068,422
TRAVELING WAVE COUPLED CAVITY PARAMETRIC AMPLIFIER

Kenneth P. Grabowski, La Mirada, Calif., assignor to Hughes Aircraft Company, Culver City, Calif., a corporation of Delaware
Filed June 5, 1961, Ser. No. 114,965
8 Claims. (Cl. 330—7)

This invention relates to traveling wave parametric amplifiers and more particularly to a traveling wave parametric amplifier of the non-degenerate type.

In a single cell parametric amplifier, a pump signal of angular frequency, $\omega_p$, is made to interact with a signal frequency of angular frequency, $\omega_s$, in a resonant cavity in a manner to effect amplification. This amplification is accompanied by the generation of an idler signal of angular frequency, $\omega_I$, whereby the sum of the signal frequency and the idler frequency is equal to the pump frequency. A traveling wave parametric amplifier, on the other hand, constitutes the equivalent of a microwave filter circuit that is periodically loaded with diodes which in effect form a series of intercoupled cells. In order that the amplification be cumulative, the sum of the phase change of the signal and idler frequencies, $\theta_s$ and $\theta_I$, respectively, between successive diodes must be approximately equal to the phase change of the pump signal, $\theta_p$. As is generally known, a traveling wave parametric amplifier is more broad banded than a single cell parametric amplifier and requires no circulator.

A traveling wave parametric amplifier wherein the signal and idler frequencies are approximately equal so that propagation thereof can be supported within the same passband of the same circuit is defined as a parametric amplifier of the "degenerate" type. On the other hand, a traveling wave parametric amplifier of the non-degenerate type is defined as a traveling wave parametric amplifier wherein an idler signal of a frequency that is of the order of two or more times the frequency of the signal to be amplified is developed and propagation thereof is supported within a passband that is higher and distinct from the passband that supports the signal being amplified. As will be hereinafter explained, a non-degenerate traveling wave parametric amplifier is inherently capable of achieving a lower noise figure than a traveling wave parametric amplifier of the degenerate type. There are numerous radar and deep space communication applications wherein it is particularly desirable to provide amplification with a lower noise figure.

It is therefore an object of the present invention to provide an improved traveling wave parametric amplifier of the non-degenerate type.

Another object of the present invention is to provide a traveling wave parametric amplifier having a comparatively low noise figure.

Still another object of the present invention is to provide a non-degenerate traveling wave parametric amplifier wherein a single circuit is employed to support and propagate the signal, idler and pump electromagnetic waves.

A further object of the present invention is to provide a traveling wave parametric amplifier incorporating rectangular coaxial cavities to enhance the coupling achievable therebetween.

In accordance with the present invention a plurality of similar rectangular coaxial cavities are disposed with each successive pair having a common broad side coextensive with the entire length thereof and are coupled together through irises located at one extremity. Further, a varactor diode is placed in series with the center conductor at the extremity of the cavities opposite from the coupling irises and are biased through low-pass filters placed within the center conductors. Lastly, three coupling irises with appropriate waveguide connectors for the signal, idler and pump frequencies are disposed in each exposed broadside of the rectangular cavities. The coupling irises for providing signal input and output ports are disposed at the extremity of the exposed broad sides farthest from the varactor diode, the coupling irises for providing terminations for the idler signal are disposed at the extremity of the exposed broad sides nearest the varactor diodes, and coupling irises for prividing pump input and output ports are disposed intermediate the signal and idler ports. Either of the signal ports may be selected as the signal input port in which case the remaining signal port becomes the signal output port. Similarly, either pump port may be selected as the pump input port independently of the signal port selection. The remaining pump port will then become the pump output port.

In operation, a traveling wave parametric amplifier in accordance with the present invention utilizes a pump signal of angular frequency, $\omega_p$, which frequency is approximately three times the angular frequency, $\omega_s$, of the signal to be amplified. The pump signal interacts with the signal to be amplified to produce an idler signal of angular frequency, $\omega_I$, which frequency is approximately twice $\omega_s$. Assuming perfect diodes and lossless circuits, the noise figure of a traveling wave parametric amplifier for radar and other similar applications is:

$$F=1+\frac{\omega_s}{\omega_I}\cdot\frac{T_I}{T_o} \quad (1)$$

wherein F is the noise figure, $T_I$ is the idler termination temperature and $T_o$ is standard room temperature. In general, the idler termination temperature, $T_I$, will substantially equal standard room temperature, $T_o$, whereby $$F=1+\frac{\omega_s}{\omega_I} \quad (2)$$

For a degenerate type of traveling wave parametric amplifier $\omega_s \approx \omega_I$ whereby the lowest noise figure one can expect is $F=2$ or, in decibels, $F=3$ db. In a non-degenerate type traveling wave parametric amplifier, however, where $\omega_s<\omega_I$, F can approach unity or zero decibels. Thus, even though the above noise figures are not realizable because of other factors which enter and which were left out of the approximations made for relation (1), it is apparent that a non-degenerate traveling wave parametric amplifier can have a substantially lower noise figure, F, than a degenerate traveling wave parametric amplifier.

The above-mentioned and other features and objects of this invention and the manner of obtaining them will become more apparent by reference to the following description taken in conjunction with the accompanying drawings, wherein.

Figure 2:
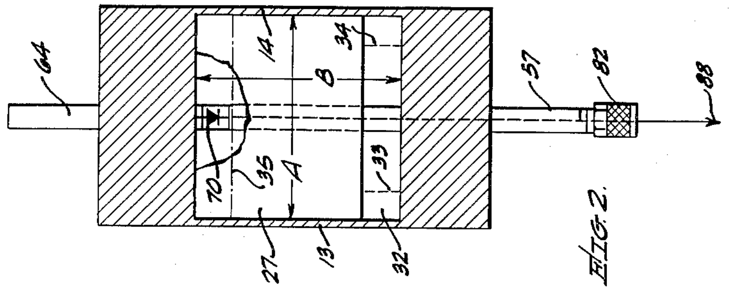
FIG. 2 is a full sectional view of section 2—2 of the device of FIG. 1.
Figure 1:
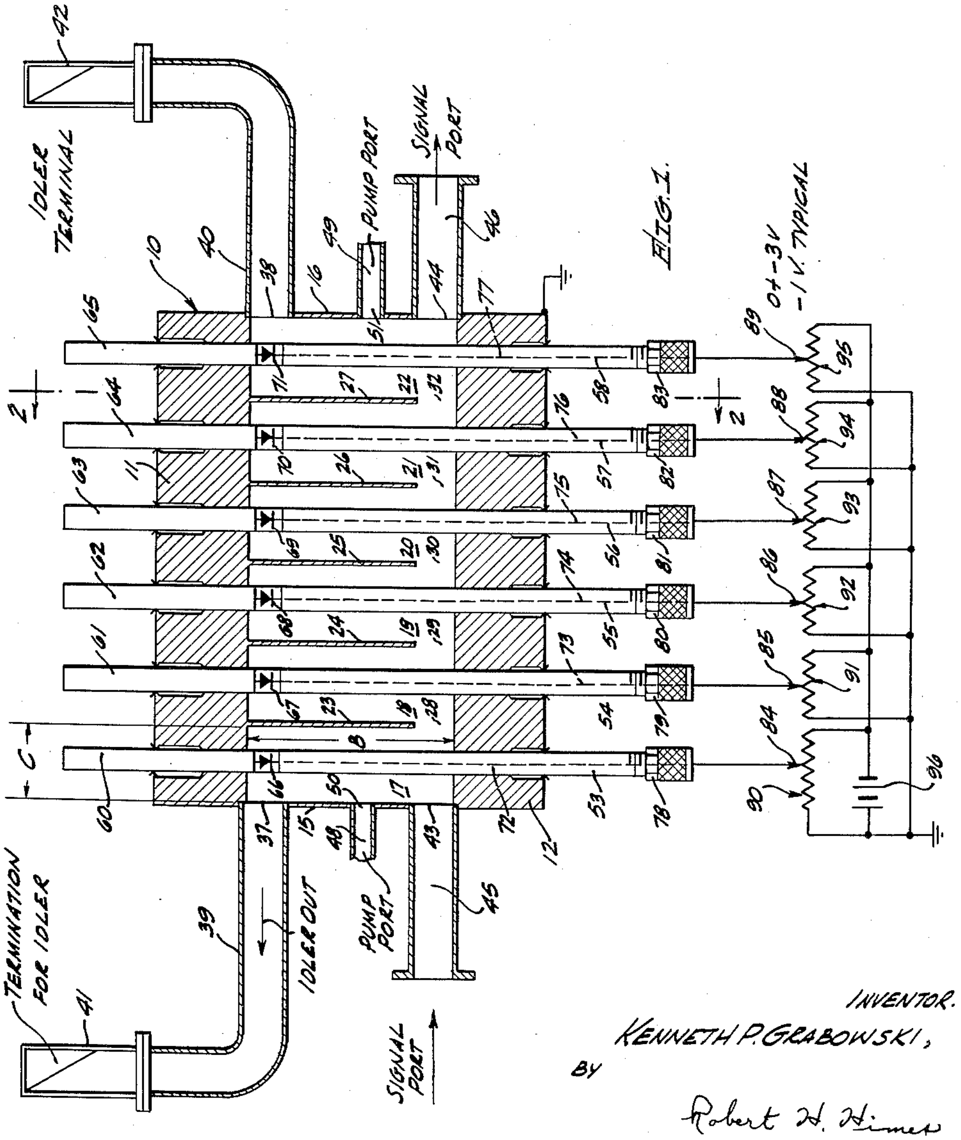
FIG. 1 is a longitudinal sectional view of the traveling wave parametric amplifier of the present invention.

Referring now to FIG. 1 of the drawings, a traveling wave parametric amplifier in accordance with the present invention comprises a block 10 of conductive material which includes upper and lower members 11, 12, respectively, having parallel adjacent surfaces separated by a distance B (see FIGS. 1 and 2). The intervening space between upper and lower members 11 and 12 is enclosed by side panels 13, 14, the inside surfaces of which are separated by distance A (see FIG. 2) and end panels 15, 16. The volume defined by upper and lower members 11, 12, side panels 13, 14 and end panels 15, 16 is divided into cavities 17, 18, 19, 20, 21 and 22 of uniform rectangular cross-section wherein dimension A is the greater dimension by conductive walls 23, 24, 25, 26 and 27 which extend from the upper member 11 to the lower member 12 and have coupling irises 28, 29, 30, 31 and 32 disposed immediately adjacent the lower member 12. The height of the coupling irises 28–32 is not critical and is selected to be in the range of from $\frac{1}{10}\lambda_p$ to $\frac{1}{4}\lambda_p$, wherein $\lambda_p$ is the wavelength of the pump signal. Further, the width of the coupling irises 28–32 may be allowed to extend all the way across (i.e., for the dimension A) between the side panels 13, 14 in which case the circuit possesses approximately a 20% passband. On the other hand, if the coupling irises 28–32 extend only ¾ of the way across, as shown by dashed lines 33, 34 (FIG. 2), the passband is decreased to approximately 10%. Alternatively, if additional coupling is desired, an additional iris may be located at the opposite extremity of each of the separating walls 23–27 immediately adjacent the upper member 11 in a manner illustrated by dashed line 35, FIG. 2. In this latter case, the passband may be increased to as high as 50%.

Coupling irises 37, 38 for the idler signal output ports are provided through the end panels 15, 16 immediately adjacent the upper member 11. Waveguide connectors 39, 40 couple the irises 37, 38, respectively, to microwave terminations 41, 42. Next, signal coupling irises 43, 44 are disposed across the end panels 15, 16, respectively, immediately adjacent the lower member 12 of conductive block 10. Signal input and output ports are provided by means of waveguide connectors 45, 46 which couple across the irises 43, 44, respectively. Lastly, pump input and output ports are provided by waveguide connectors 48, 49 which are connected across coupling slots 50, 51, which slots 50, 51 extend transversely across the end panels 15, 16, respectively, and are spaced $\frac{1}{2}\lambda_p$ from the lower member 12 of block 10. This latter spacing does not appear to be critical.

Cylindrical conductors 53, 54, 55, 56, 57 and 58 are disposed through the lower member 12 in the cavities 17–22, respectively, to a point opposite the openings of irises 37 and 38 in a manner to make the cavities 17–22 rectangular coaxial cavities. Cylindrical conductors 60, 61, 62, 63, 64 and 65 are disposed through the upper member 11 directly opposite the cylindrical conductors 53–58, respectively, but are terminated in a manner to leave gaps for mounting diodes between the corresponding cylindrical conductors. The cylindrical conductors 53–58 and 60–65 are threaded or otherwise made movable with respect to the lower and upper members 12, 11, respectively, so that the position of the gaps therebetween made be adjusted. Diodes 66, 67, 68, 69, 70 and 71 are mounted between the cylindrical conductors 53, 60; 54, 61; 55, 62; 56, 63; 57, 64; and 58, 65, respectively. Diodes 66–71 are back-biased through leads shown as dashed lines 72, 73, 74, 75, 76 and 77 connected from the electrodes thereof, respectively, through the cylindrical conductors 53–58 and lowpass filters 78, 79, 80, 81, 82 and 83 to adjustable taps 84, 85, 86, 87, 88 and 89 of potentiometers 90, 91, 92, 93, 94 and 95, respectively. Potentiometers 90–95 are in turn connected across a source of potential 96 which provides a potential of the order of 3 volts and has the negative terminal thereof referenced to ground so as to provide a negative bias. In general, the adjustable taps 84–89 of potentiometers 90–95, respectively, are adjusted to provide a potential of the order of −1 volt relative to ground. The diameter of the cylindrical conductor 53–58 and 60–65 is uniform and is chosen to optimize the impedance match of the rectangular coaxial cavities 17–22 to the diodes 66–71. Lastly, the bias and the position of the diodes 66–71 within the coaxial cavities 17–22, respectively, are adjusted to achieve optimum interaction between the signal to be amplified and the pump signal. The position of the diodes 66–71 is adjusted by adjusting the position of the gaps between cylindrical conductors 53–58 and 60–65, respectively, in the manner previously described The following dimensions have been found to produce satisfactory operation in an embodiment of the present invention designed for a signal idler of a frequency in C-band and a pump of a frequency in X-band:

A=1.2 inches. (3)

B=1.6 inches. (4)

Height of irises 28–32=0.2 inch.

Pump ports 50, 51 are 0.1 inch high and are centered approximately 0.5 inch from the inner surface of member 12.

Figure 3:
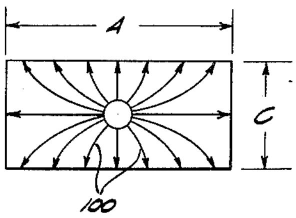
FIG. 3 shows the transverse electric field pattern of a rectangular coaxial cavity.

Referring to FIG. 3, there is shown a schematic cross-section of one of the cavities 17, 18, 19, 20, 21 or 22 and more particularly the transverse electric field pattern therein designated by directional lines 100. The dimension intermediate end panels 15, 16 and adjacent dividers 23, 27, respectively, and between successive dividers 23–27 is designated "c," i.e., the dimension orthogonal to dimension A as viewed in the figure. In the disclosed device, the dimension A is made greater than the dimension C thereby to maintain satisfactory coupling between successive cavities 17, 18, 19, 20, 21 and 22.

Figure 4:
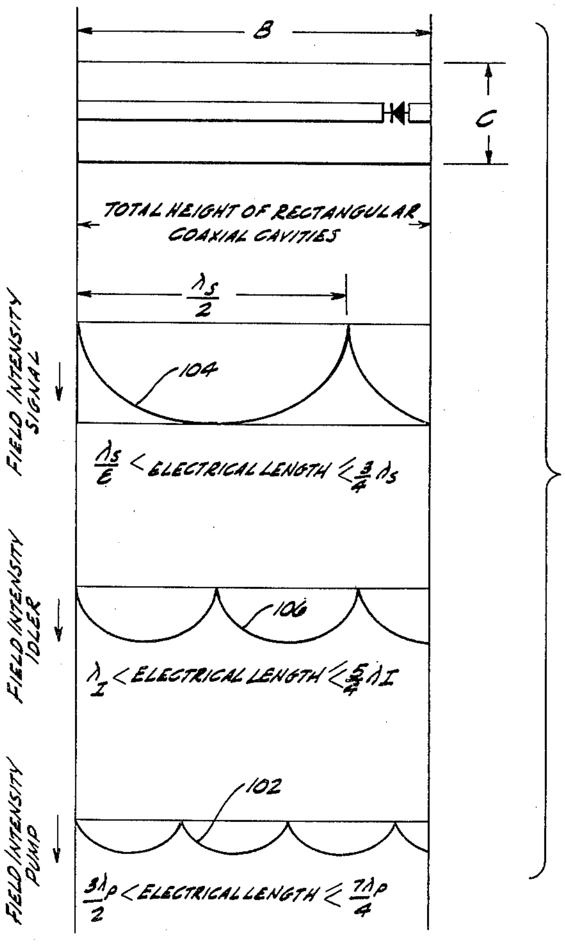
FIG. 4 shows the field intensity distribution along the length of the rectangular coaxial cavities in the circuit of the traveling wave parametric amplifier of FIG. 1.

In the operation of the traveling wave parametric amplifier of the present invention, a pump signal of angular frequency, $\omega_p$, is applied to either of the pump ports provided by waveguide connections 48 or 49 in which case the remaining waveguide termination 48 or 49 is terminated with an appropriate load impedance. The application of the pump signal to the waveguide termination 48, for example, excites the iris 50 which, in turn, energizes cavities 17 in the manner shown by characteristic 102 of FIG. 4. Referring to FIG. 4, the dimension B of cavity 17 is of sufficient electrical length so as to support the fourth coaxial cavity mode whereby more than three one-half wavelengths of the pump signal and less than seven one-quarter wavelengths appear therealong. The subsequent rectangular coaxial cavities 18–22 are energized with the pump signal in a similar manner through the irises 28–32. Lastly, the pump signal in rectangular coaxial cavity 22 energizes output iris 51 which signal is propagated through waveguide connection 49 and appropriately terminated.

Next, the signal to be amplified of angular frequency, $\omega_s$, which in the present case is approximately one-third the angular frequency, $\omega_p$, is applied to one of the waveguide connections 45 or 46, in which case the remaining one of the waveguide connections 45 or 46 constitutes the signal output port. If the signal is applied to the waveguide connection 45, for example, the rectangular coaxial cavity 17 is energized through the iris 43, in a manner such that a wave having the characteristic 104, FIG. 4, appears therealong. That is, the dimension B is of sufficient electrical length to support a full one-half wavelength at the signal frequency plus an additional portion less than one-quarter wavelength to appear along the length of cavity 17. This particular mode shown by characteristic 104 is designated as the second coaxial cavity mode and is necessary to effect coupling through the apertures 28–32. Thus, the successive rectangular coaxial cavities 18–22 are energized in a manner similar to cavity 17 through the irises 28–32.

The signal of angular frequency, $\omega_s$, and the pump signal of angular frequency, $\omega_p$, interact in a manner to transfer energy from the pump signal to the signal being amplified and to generate an idler signal of angular frequency, $\omega_I$. The dimension B of the rectangular coaxial cavities 17–22 is concurrently of sufficient electrical length to support the third coaxial cavity mode whereby the idler signal thus generated has the electric field intensity pattern shown by characteristic 106, FIG. 4. In general, the electrical length of the rectangular coaxial cavities 17–22 is sufficient to support a full wavelength plus an amount less than one-quarter wavelength along the dimension B of the respective cavities 17–22. The idler signal energizes the output irises 37, 38 and is propagated by the waveguide connections 39, 40, respectively, to the terminations 41, 42. Lastly, the adjustable taps 84–89 of the potentiometers 90–95, respectively, are adjusted to effect optimum amplification of the signal frequency which in general is to apply a bias of the order of −1 volt relative to ground to the respective diodes 66–71.

Figure 5:
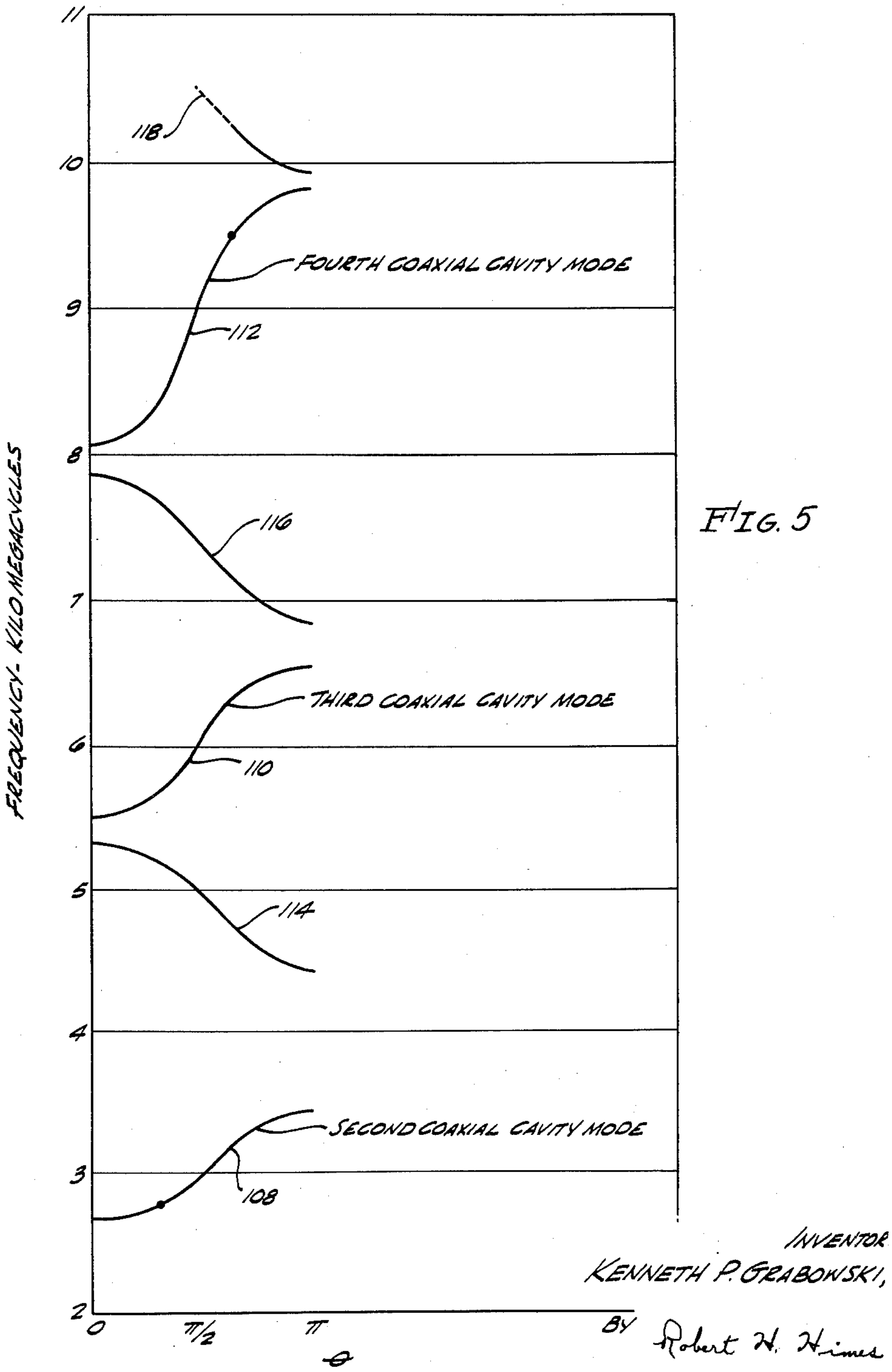
FIG. 5 illustrates the various modes supported and propagated by the coupled rectangular coaxial cavity circuit of the traveling wave parametric amplifier of FIG. 1.

Referring to FIG. 5, there is shown a graphical representation of the relationship of the various modes capable of being excited in the rectangular coaxial cavities 17–22. In particular, the characteristic 108 illustrates the second coaxial cavity mode utilized by the signal being amplified; the characteristic 110 illustrates the third coaxial cavity mode used for the idler signal; and the characteristic 112 illustrates the fourth coaxial cavity mode utilized by the pump signal. The rectangular coaxial cavities 17–22 present a very low impedance to frequencies within the passbands of the remaining modes illustrated by characteristics 114, 116, 118. Energy within these passbands does not interact with the diodes 66–71. It is to be noted that the signal of frequency, $\omega_s$, utilizes the mode or passband shown by characteristic 108, which passband covers the S-band region; i.e., signals of the order of 3000 megacycles per second. The idler signal, on the other hand, utilizes the passband covered by the characteristic 110, which passband covers signals in the C-band region; i.e., signals of the order of 6000 megacycles per second. The pump signal utilizes the passband covered by the characteristic 112, which passband covers the X-band region; i.e., signals of the order of 9000 megacycles per second. It is to be further noted that the signal frequency, $\omega_s$, plus the idler frequency, $\omega_I$, is substantially equal to the pump frequency, $\omega_p$. As previously specified, the width of the passbands covered by the characteristics 108, 110 and 112 is determined by the coupling apertures 28–32 and can be made either narrower or broader in the manner previously described.

Although the invention has been shown in connection with a certain embodiment, it will be readily apparent to those skilled in the art that various changes in form and arrangement of parts may be made to suit requirements without departing from the spirit and scope of the invention.

What is claimed is:

1. A traveling wave parametric amplifier comprising a plurality of coaxial cavities disposed in succession, each of said cavities having a center conductor with a gap at one extremity thereof and each being of predetermined length to support the second, third and fourth coaxial modes and each adjacent pair of said cavities having a common side; a corresponding plurality of diodes disposed across each of said gaps at said one extremity of said center conductors; means disposed at the extremity of said cavities opposite from said one extremity for providing coupling for said second, third and fourth coaxial modes therebetween; means for exiciting a pump signal supported by said fourth coaxial mode in said cavities; means for exciting a signal to be amplified supported by said second coaxial mode in an outer one of said succession of coaxial cavities; means for biasing said diodes thereby to amplify said signal to be amplified and to generate an idler signal supported by said third coaxial mode in said cavities; and means for coupling to said second coaxial cavity mode supported by the remaining outer one of said succession of coaxial cavities thereby to provide a signal output.

2. The traveling wave parametric amplifier as defined in claim 1 wherein said means disposed at the extremity opposite from said one extremity of said cavities for providing coupling for said second, third, and fourth coaxial modes between successive cavities includes an aperture at said extremity opposite from said one extremity in each of said common sides, said apertures extending at least a portion of the distance thereacross.

3. The traveling wave parametric amplifier as defined in claim 2 which additionally includes an aperture at said one extremity in each of said common sides, said apertures extending at least a portion of the distance thereacross thereby to increase the passband of said amplifier.

4. A traveling wave parametric amplifier comprising 1, 2 . . . $m$ . . . $n$ coaxial cavities of a length for simultaneously supporting the second, third and fourth coaxial modes wherein $n$ is an integer no less than 2 and $m$ successively assumes numbers from 1 to $(n-1)$, inclusive, said $n$ cavities having a center conductor with a gap at one extremity thereof and being disposed in succession with the $m$ and $(m+1)$ cavities each having a common side; a varactor diode disposed across said gap in each of said center conductors; means for providing coupling between said $m$ and $(n+1)$ cavities at the extremity thereof opposite from said one extremity for said second, third and fourth coaxial modes; means for exciting a pump signal supported by said fourth coaxial mode in said 1st cavity; means for exciting one of said 1st and $n^{th}$ cavities with a signal to be amplified supported by said second coaxial mode whereby said signal to be amplified is amplified and an idler signal supported by said third coaxial mode is generated in said cavities; and means for coupling to the second coaxial mode in the remaining one of said 1st and $n^{th}$ cavities thereby to provide a signal output.

5. The traveling wave parametric amplifier as defined in claim 4 which additionally includes means for longitudinally moving said center conductors within said $n$ cavities thereby to adjust the position of said diodes to achieve maximum amplification of said signal to be amplified.

6. A traveling wave parametric amplifier comprising 1, 2 . . . $m$ . . . $n$ rectangular coaxial cavities of a length for supporting the second, third and fourth coaxial modes wherein $n$ is an integer no less than 2 and $m$ successively assumes numbers from 1 to $(n-1)$, inclusive, said $n$ cavities having a center conductor with a gap at one extremity thereof and being disposed in succession with the $m$ and $(m+1)$ cavities having a common broad side; a varactor diode disposed across said gap in each of said center conductors; means for providing coupling between said $m$ and $(m+1)$ cavities at the extremity thereof opposite from said one extremity for said second, third and fourth coaxial modes; means for exciting a pump signal supported by said fourth coaxial mode in said 1st cavity; means for exciting one of said 1st and $n^{th}$ cavities with a signal to be amplified supported by said second coaxial mode; means for biasing said diodes thereby to amplify said signal to be amplified and to generate an idler signal supported by said third coaxial mode in said cavities; and means for coupling to the second coaxial mode in the remaining one of said 1st and $n^{th}$ cavities thereby to provide a signal output.

7. The traveling wave parametric amplifier as defined in claim 6 wherein said means for providing coupling between said $m$ and $(m+1)$ cavities at the extremity thereof opposite from said one extremity for said second, third and fourth coaxial modes includes an aperture at said extremity opposite from said one extremity in each of said common broad sides, said apertures extending at least a portion of the distance thereacross.

8. The traveling wave parametric amplifier as defined in claim 7 which additionally includes an aperture at said one extremity in each of said common broad sides, said apertures extending at least a portion of the distances thereacross thereby to increase the passband of said amplifier.

No references cited.